US005142139A

United States Patent [19]

Hayashi et al.

[11] Patent Number: 5,142,139

[45] Date of Patent: Aug. 25, 1992

[54] APPARATUS FOR TREATING IMAGE INFORMATION OF PRINTED MATERIAL AND DISCRIMINATING SAME

[75] Inventors: Makoto Hayashi, Zama; Shizunori Kaneko, Odawara; Mitsuhiko Iida, Yokohama; Mutsumi Naniwa, Chigasaki; Seiichi Tsuchiya, Gotenba; Kimio Suzuki, Numazu, all of Japan

[73] Assignee: Toshiba Kikai Kabushiki Kaisha, Tokyo, Japan

[21] Appl. No.: 656,490

[22] Filed: Feb. 19, 1991

[30] Foreign Application Priority Data

Feb. 22, 1990 [JP] Japan .................................... 2-41721

[51] Int. Cl.[5] .......................................... H01L 31/0232

[52] U.S. Cl. .............................. 250/208.1; 250/227.2; 250/227.28

[58] Field of Search ............... 250/208.6, 208.2, 208.1, 250/227.20, 227.28

[56] References Cited

U.S. PATENT DOCUMENTS 3,518,440 6/1970 Hanson et al. ...................... 250/557
4,656,517 4/1987 Shida et al. .................... 358/213.28
4,674,834 6/1987 Margolin ............................ 385/121

FOREIGN PATENT DOCUMENTS 62-11153 1/1987 Japan .

*Primary Examiner*—Constantine Hannaher
*Attorney, Agent, or Firm*—Stevens, Davis, Miller & Mosher

[57] ABSTRACT

A printing machine such as a rotary offset press includes a printed material monitoring apparatus comprising sensor units for detecting light reflected from a number of unit pixel domains which are divided in a direction perpendicular to a direction in which a print surface of a printed material flows, optical fiber units for transmitting light reflected from the unit pixel domains to the sensor units and a signal processing unit for processing signals transmitted from the sensor units. The sensor units comprise detection sensors each being equipped with a plurality of light reception elements corresponding to the unit pixel domains respectively. The light reception elements are arranged in a plurality of rows of a fixed amount in a direction in which the print surface of the printed material flows to form groups of fixed amount of rows in which the light reception elements are arranged. The signal processing unit comprises analog multiplexer for multiplexing analog information detected by each of the light reception elements in the groups in which the rows of the light reception elements are arranged and digital multiplexer for further digitizing and multiplexing the multiplexed analog information transmitted from each of the groups of the light reception elements.

6 Claims, 10 Drawing Sheets

APPARATUS FOR TREATING IMAGE INFORMATION OF PRINTED MATERIAL AND DISCRIMINATING SAME

BACKGROUND OF THE INVENTION

The present invention relates to a printed material monitoring apparatus used for various printing machines such as a rotary offset press particularly for detecting defects such as dirt on a printed material.

A printed material monitoring apparatus of conventional type includes a detection sensor which monitors dirt present on a print surface. Such dirt on the print surface is caused by factors such as ink splashing, water dripping or oil dripping and must be always monitored during the time of the printing process. The detection sensor is arranged so as to extend in a direction perpendicular to the direction in which the print surface moves. The detection sensor successively scans the print surface in a linear manner so as to monitor dirt on the print surface.

The detection sensor is constructed in such a manner that charge coupled devices (CCDs) or light reception elements of a photosensor are linearly arranged in measurement points (hereinafter referred to as unit pixel domains) on the print surface to be detected. Each of the CCDs or light reception elements corresponds to each of unit pixel domains. With such detection sensor, since the size of the spaces between lines on which the light reception elements are arranged cannot be less than the size of a light reception element, a resolution is limited to the size of the light reception element. For the reason described above, various printed material monitoring apparatus have been proposed in which light reflected from these unit pixel domains is transmitted to the light reception elements by using optical fibers, whereby a resolution less than the size of the light reception element is obtained (for example, refer to Japanese Patent Laid-open Publication No. 62-11153).

In the described conventional art, however, as the size of the unit pixel domain is subdivided so as to enhance the resolution of detection, the number of light reception elements increases accordingly, so that the length of the detection sensor is augmented. In such a case, the distance between the unit pixel domains and the corresponding light reception elements at the center of the print surface differs from the distance between the unit pixel domains and the corresponding light reception elements on the sides of the print surface. As a result, the length of the optical fibers connecting the unit pixel domains to the light reception elements at the center become short, whereas the length of the optical fibers linking the unit pixel domains to the light reception elements on the sides of the print surface become very long. This results in a problem in that the attenuating factor of the quantity of detected light in the unit pixel domains on both sides of the print surface is increased, thus making it impossible to accurately detect defects such as dirt on the print surface. Especially, when the resolution is enhanced, because of the small area of the unit pixel domain, the quantity of light to be detected is small. The attenuation is such that an optical fiber may have a negative effect on the detection of defects.

Furthermore, in order to perform the process at high speeds, an examination domain is subdivided. However, when the number of unit pixel domains is increased by subdividing an examination domain, the amount of information naturally increases. Therefore, an improvement in resolution and a high-speed process are two problems having opposing solutions. Thus, there has been a demand for realization of an improved printed material monitoring apparatus in which these two problems can be solved.

SUMMARY OF THE INVENTION

An object of the present invention is to substantially eliminate defects or drawbacks encountered in the prior art described above and to provide a printed material monitoring apparatus capable of accurately detecting dirt or the like on a print surface of the material at high speed.

This and other objects can be achieved according to the present invention by providing a printed material monitoring apparatus comprising sensor means for detecting light reflected from a number of unit pixel domains which are divided in a direction perpendicular to a direction in which a print surface of a printed material flows, optical fiber means for transmitting light reflected from the unit pixel domains to the sensor means and a signal processing unit for processing signals transmitted from the sensor means, the sensor means comprising detection sensors each being equipped with a plurality of light reception elements corresponding to the unit pixel domains respectively, the optical fiber means being composed of a plurality of optical fibers for transmitting light reflected from the unit pixel domains to the light reception elements respectively, and the light reception elements being arranged in a plurality of rows of a fixed amount in a direction in which the print surface of the printed material flows to form groups of fixed amount of rows in which the light reception elements are arranged.

In a preferred embodiment, the signal processing unit comprises analog multiplexing means for multiplexing analog information detected by each of the light reception elements in the groups in which the rows of the light reception elements are arranged and digital multiplexing means for further digitizing and multiplexing the multiplexed analog information transmitted from each of the groups of the light reception elements. The analog multiplexing means includes a log amplifier and is used for multiplexing the analog information, transmitted from each of the light reception elements, which has been turned into a logarithm and luminous density by the log amplifier. The sensor means includes unit printed board means on which the light reception elements for a multiplexing process are grouped and the analog multiplexing means is arranged on the unit printed board means. The monitoring apparatus comprises a defect detecting and processing unit including a comparison determination means in which a plurality of signal line systems, for multiplexing information by the digital multiplexing means, are arranged and in which multiplexed information from each of the signal line systems is processed and determined in a parallel manner.

According to the printed material monitoring apparatus of the present invention of the characters described above, since the light reception elements are arranged in the direction in which the print surface flows, the difference of the length of the optical fibers is not more than the maximum difference between the length of the optical fibers on both the sides of the print surface and the length of the optical fibers at the center of the print surface. The length of optical fibers can be made as equal as possible, whereby the electrical properties can be made the same.

Moreover, analog information from the light reception elements in each group of rows of the light reception elements is multiprocessed. The multiplexed analog information can be processed at high speeds by further multiplexing it with the digital multiplexing means. In addition, a plurality of systems of the digital multiplexing lines are provided in the comparison determination units, whereby multiplexed information of each system can be processed at high speeds in a parallel manner.

BRIEF DESCRIPTION OF THE DRAWINGS

For a better understanding of the pre invention and to show how the same is carried out, reference is made, by way of a preferred embodiment, to the accompanying drawings, in which.

DESCRIPTION OF THE PREFERRED EMBODIMENT

Figure 1:
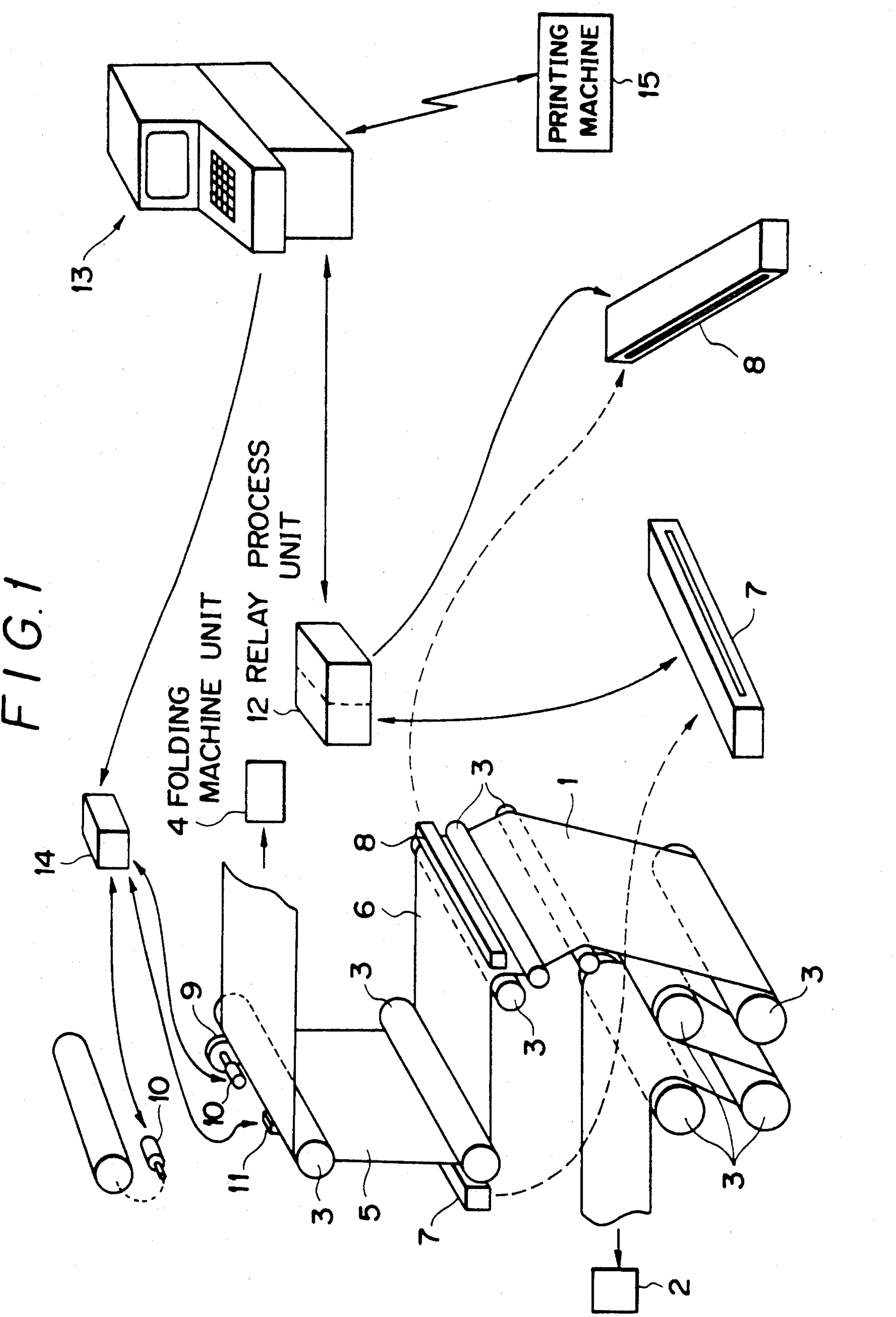
FIG. 1 is a view showing a schematic constructional arrangement of a printed material monitoring apparatus according to the present invention.

A preferred embodiment of the present invention will now be described hereunder with reference to the accompanying drawing. First, referring to FIG. 1 which shows the conceptional configuration or arrangement of a printed material monitoring apparatus according to the present invention, a printed material 1, or web, is carried and guided by a plurality of conveying rollers 3 from a printing unit 2 to a folding machine unit 4. A main sensor 7 for the obverse surface and a main sensor 8 for the reverse surface are both provided on the way of a conveying path in order to detect dirt on the obverse surface 5 as well as the reverse surface 6 of the web 1. Furthermore, a touch roller 9, which is in contact with the web 1 and thereby rotating together with the web 1, is provided on the downstream side of the main sensor 7, to which the web 1 flows. An encoder 10 is attached to the touch roller 9. A start mark sensor 11 is mounted in the position of the touch roller 9 and is used for determining, for example, the start time of a signal process. The start mark sensor 11 detects a peculiar mark formed on an unillustrated print surface, thereby starting the signal process.

Signals detected by main sensors 7 and 8 are transmitted to a main process unit 13 via a relay process unit 12. On the other hand, the encoder 10 and the start mark sensor 11 are connected to the main process unit 13 through a mark sensor process unit 14. The main process unit 13 controls a printing machine 15.

Figure 2:
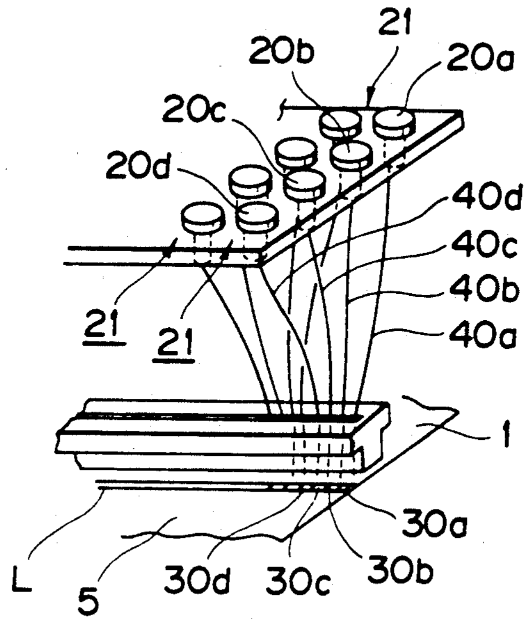
FIG. 2 is a perspective view showing a part of a sensor of the printed material monitoring apparatus of FIG. 1.

The main sensors 7 and 8 are each linear members which extend in a direction perpendicular to the direction in which the print surfaces flow. These sensors 7 and 8 scan the print surfaces 5 and 6 every time linear detection domains, each having a fixed width, pass the sensors 7 and 8, thereby successively monitoring dirt present on the print surfaces. The sensors 7 and 8 each have many light reception elements 20, each of which corresponds to each unit pixel domain 30 as shown in FIG. 2. One unit pixel domain is one of many detection zones which are divided by the linear detection domain L formed on the print surfaces 5 and 6. In this embodiment, such a unit pixel domain 30 has a width of 5 mm in the direction of the detection line, perpendicular to the direction in which the web 1 flows, and a width of 1 mm in the direction in which the web flows.

Figure 4:
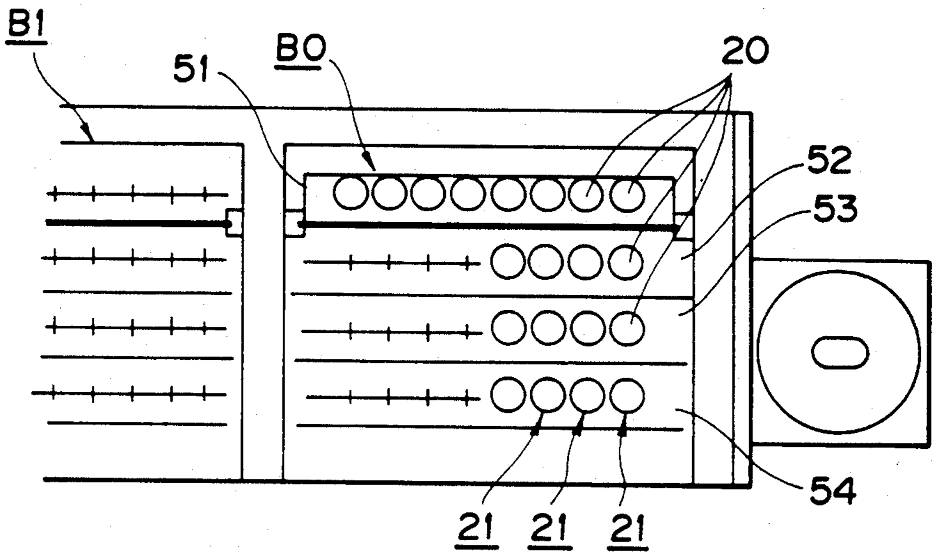
FIG. 4 is a plan view illustrating the main parts of FIG. 3.
Figure 5:
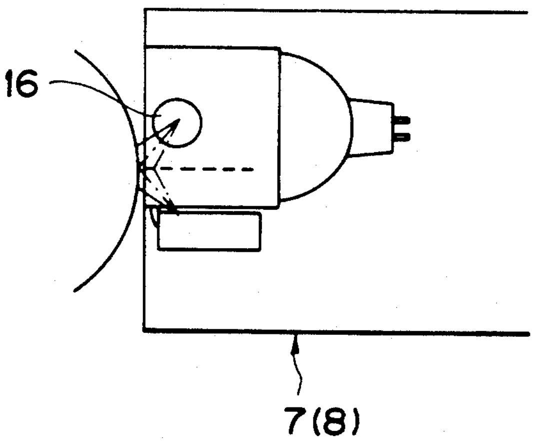
FIG. 5 is a partial side view of FIG. 3.
Figure 6:
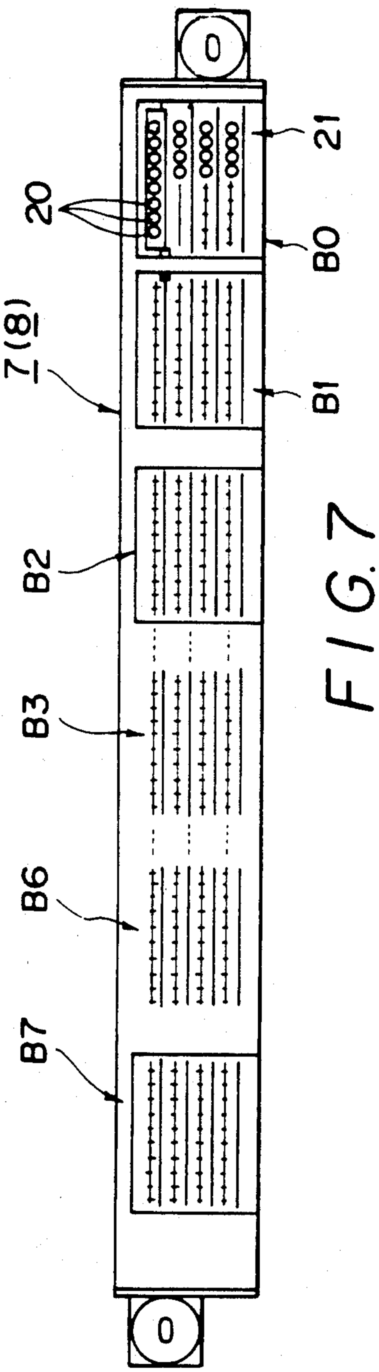
FIG. 6 is a plan view illustrating an entire sensor.
Figure 7:
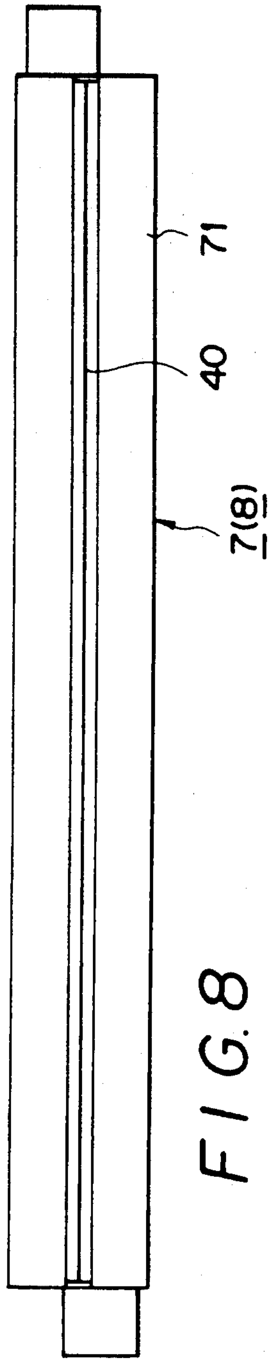
FIG. 7 is a bottom view of FIG. 6.
Figure 8:
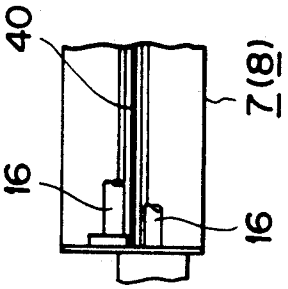
FIG. 8 is a sectional view of the sensor of FIG. 7 in which a case of the bottom of the sensor is removed.
Figure 9:
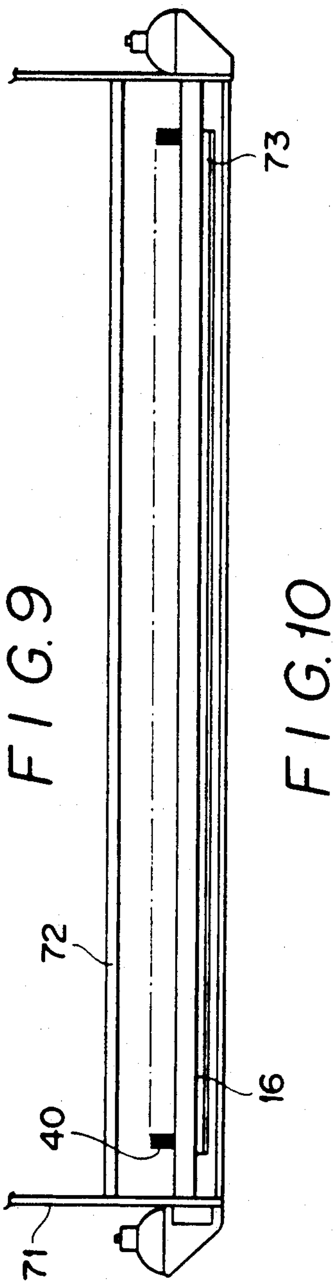
FIG. 9 is a side view in which light reception elements are removed, the case is shown in cross section and only a light source is shown.
Figure 10:
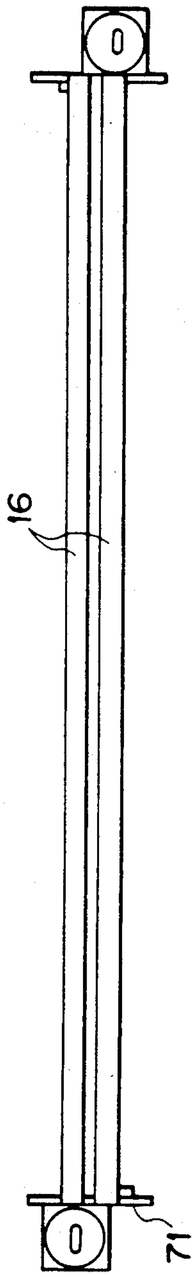
FIG. 10 is a bottom view of FIG. 9.
Figure 11B:
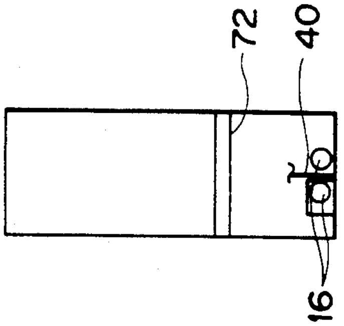
FIG. 11B is a sectional side elevation thereof.
Figure 11A:
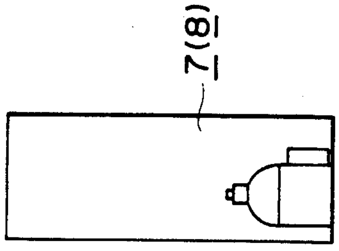
FIG. 11A is a side view of FIG. 9.

As shown in FIGS. 2, 4 and 6, the light reception elements 20 are arranged in the direction in which the web 1 flows so as to form a plurality of columns 21 of the light reception elements. These light reception elements 20 of the main sensors 7 and 8 are arranged for every unit pixel domain 30, which is positioned adjacent to the next unit pixel domain. The number of the light reception elements 20 corresponds to the fixed amount of the unit pixel domains 30. A fixed number of columns 21 of the light reception elements, eight columns in this embodiment, are regarded as a block of columns of the light reception elements. Thus, eight blocks are formed, ranging from block B0 to block B7. In each block, four rows of light reception elements 20 are arranged in the direction in which the web 1 flows, whereas eight columns are arranged in the direction perpendicular to the direction in which the web 1 flows. Therefore, a total of 32 light reception elements are arranged in each block.

Each light reception element 20 corresponds to each unit pixel domain 30. Optical fibers 40 are interposed between light reception elements 20 and unit pixel domains 30. Light reflected from the unit pixel domain 30 is transmitted through the respective optical fibers 40 to the light reception elements 20.

The optical fibers 40 are arranged as illustrated in FIG. 2. If the unit pixel domain 30 to be detected is divided into 30*a*, 30*b*, 30*c*, and 30*d* from one end thereof, and if the light reception elements 20 of one column 21 are called 20*a*, 20*b*, 20*c*, and 20*d*, from one end of the column, then a first optical fiber 40*a* is interposed between the unit pixel domain 30*a* and the light reception element 20*a*, a second optical fiber 40*b* is interposed between the unit pixel domain 30*b* and the light reception element 20*b*, a third optical fiber 40*c* is interposed between the unit pixel domain 30*c* and the light reception element 20*c*, and a fourth optical fiber 40*d* is interposed between the unit pixel domain 30*d* and the light reception element 20*d*.

Figure 3:
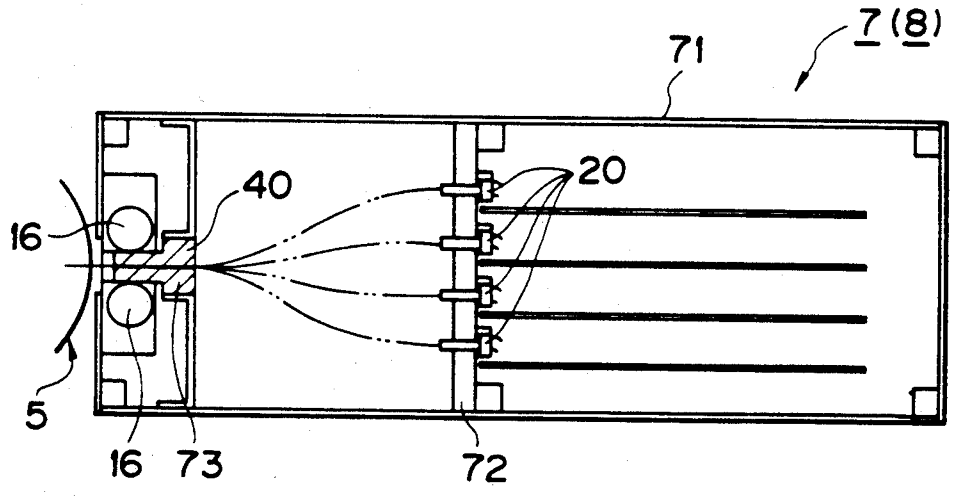
FIG. 3 is a vertical sectional view of the sensor shown in FIG. 2.

As shown in FIGS. 2 and 3, the length of the optical fiber 40 is therefore only the difference between the first optical fiber 40*a* and the second optical fiber 40*b*. The relationship between each column 21 of light reception elements and each unit pixel domain 30 is the same as described above, and thus the length of the optical fiber can be made equal.

The main sensors 7 and 8 each have a hollow, rectangular parallelepiped-shaped housing 71. The light reception elements 20 and the optical fibers 40 are arranged within this housing 71. In other words, one side of the housing 71 faces the print surface 5 or 6. An attaching wall 72, for attaching the light reception elements 20, is disposed in a position inside the housing 71, this position being separated by a fixed space from the print surface 5 or 6. A head 73, which is opposite to the linear detection domain L perpendicular to the direction in which the print surface 5 or 6 flows, is placed facing the print surface 5. The tips of optical fibers 40 are linearly disposed in the head 73, whereas the other tips of the optical fibers 40 are connected to the light reception elements 20 in all blocks B0, Bl, B2, etc. of the above housing 71 so as to irradiate the linear detection domain L.

Furthermore, as shown in FIGS. 5 and 8 through 11, light sources 16 are provided facing each other across the head 73.

Figure 12:
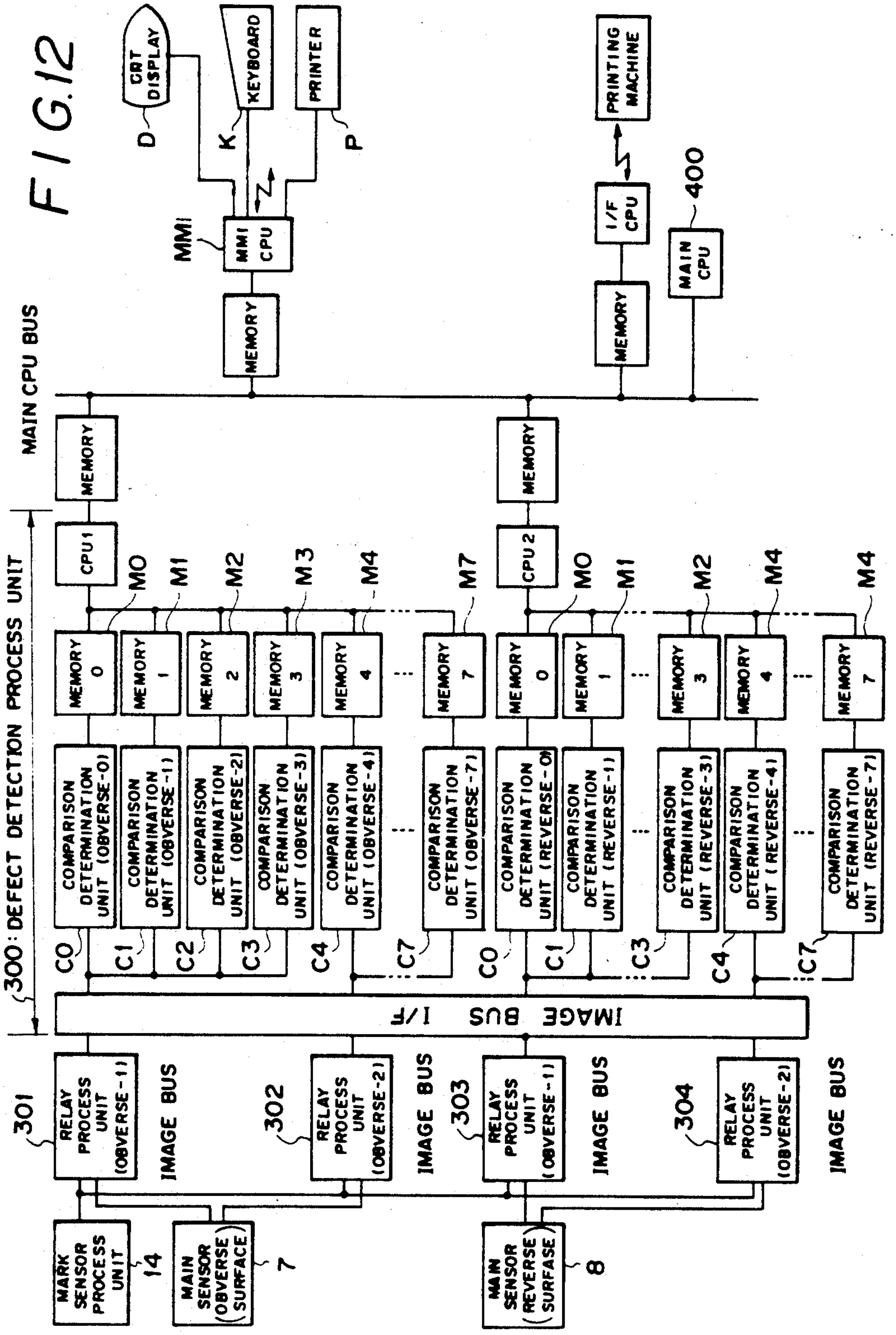
FIG. 12 is a block diagram illustrating the overall configuration of a control system of the present invention.

FIG. 12 is a block diagram illustrating the overall configuration of the control system of this embodiment. The control system is composed of a mark sensor process unit 14, the main sensor 7 for the obverse surface, the main sensor 8 for the reverse surface, a first relay process unit 301 and a second relay process unit 302, both of which relay process units are for the obverse surface, a first relay process unit 303, a second relay process unit 304, both which relay process units are for the reverse surface and a defect detection process unit 300. These first and second relay process units 301, 303, 302 and 304 convert analog information sent from the sensors 7 and 8 into digital information so as to multiplex it. The defect detection process unit 300 detects defects on the print surface based on digital information sent from the relay process units.

This defect detection process unit 300 is provided with memories M0, M1, M3 . . . M7, for the obverse and reverse surfaces, and comparison determination portions C1, C2, C3 . . . C7. Criterion data as well as allowable value data are stored in these memories M0, M1, M3 M7. The comparison determination portions C1, C2, C3 C7 each compare the criterion data with data which has been detected. The defect detection process unit 300 is also provided with a central processing unit (CPU) 1 and a CPU 2 for performing various control functions, such as displaying determination results and ejecting defective printed materials based on the determination results.

A cathode ray tube (CRT) display D, a keyboard K and a printer P are all connected to a bus of main CPU 400 via a machine interface MM1, whereby determination results can be monitored on the CRT display.

Figure 13:
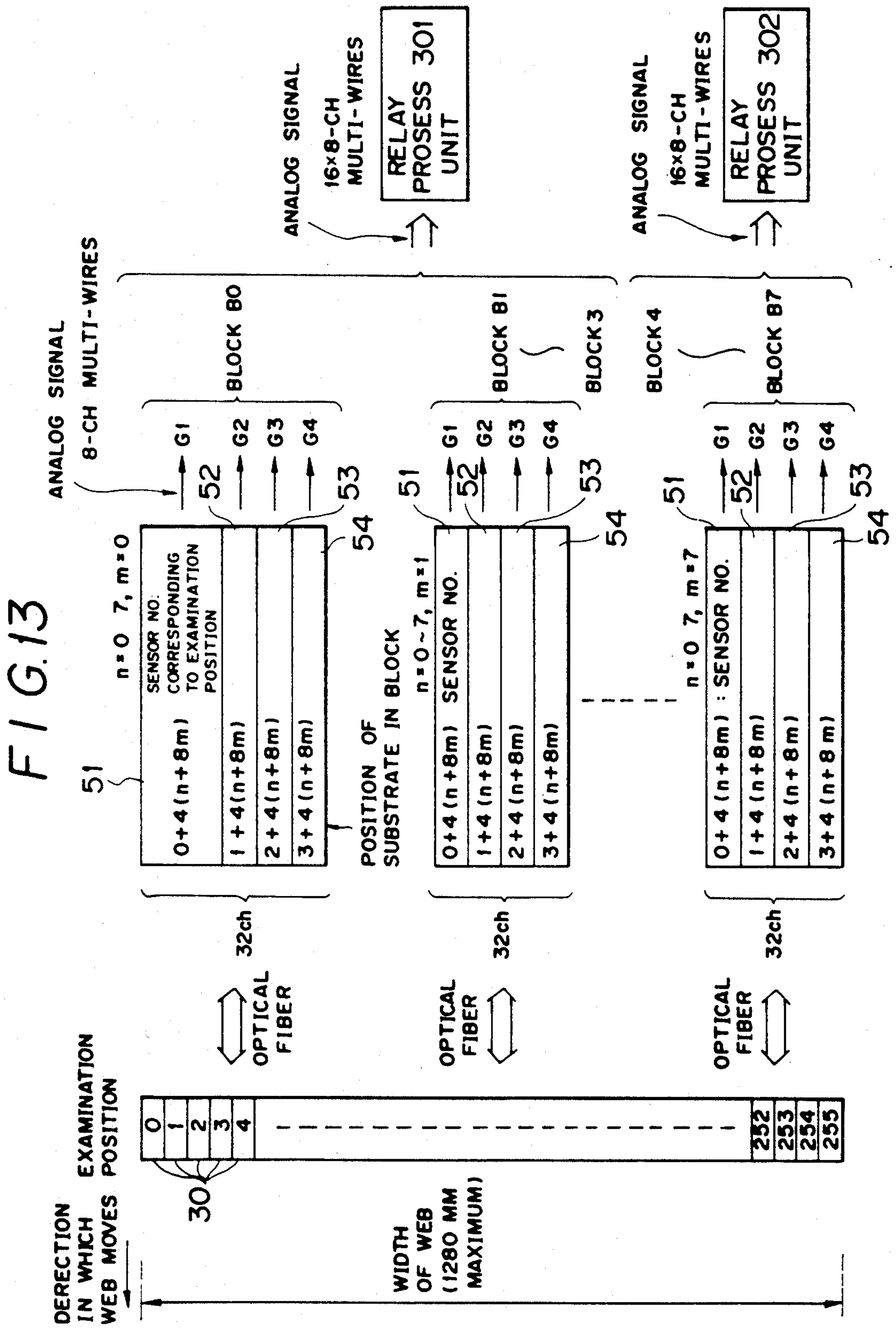
FIG. 13 is a block diagram showing a signal process system of a detection sensor.
Figure 14:
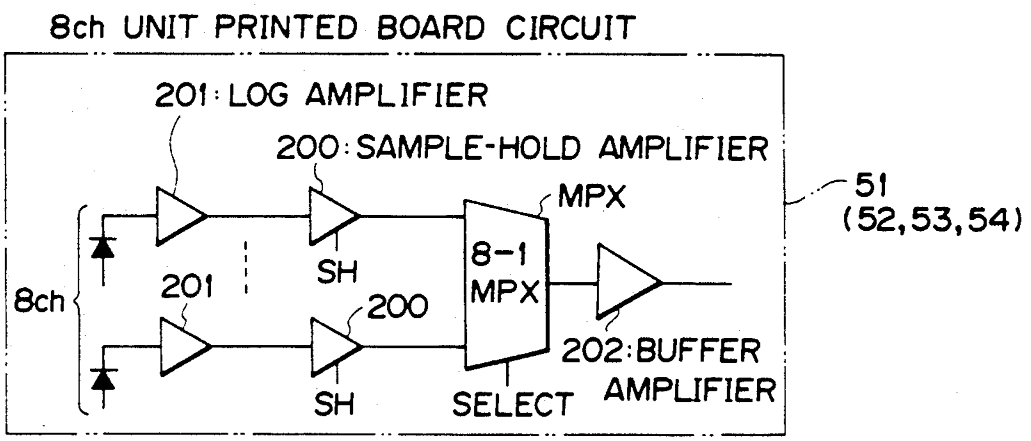
FIG. 14 is a circuit diagram of a unit printed board shown in FIG. 13.
Figure 15:
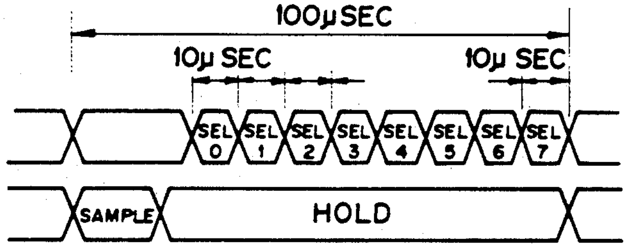
FIG. 15 is a time chart of the circuit shown in FIG. 13.
Figure 16:
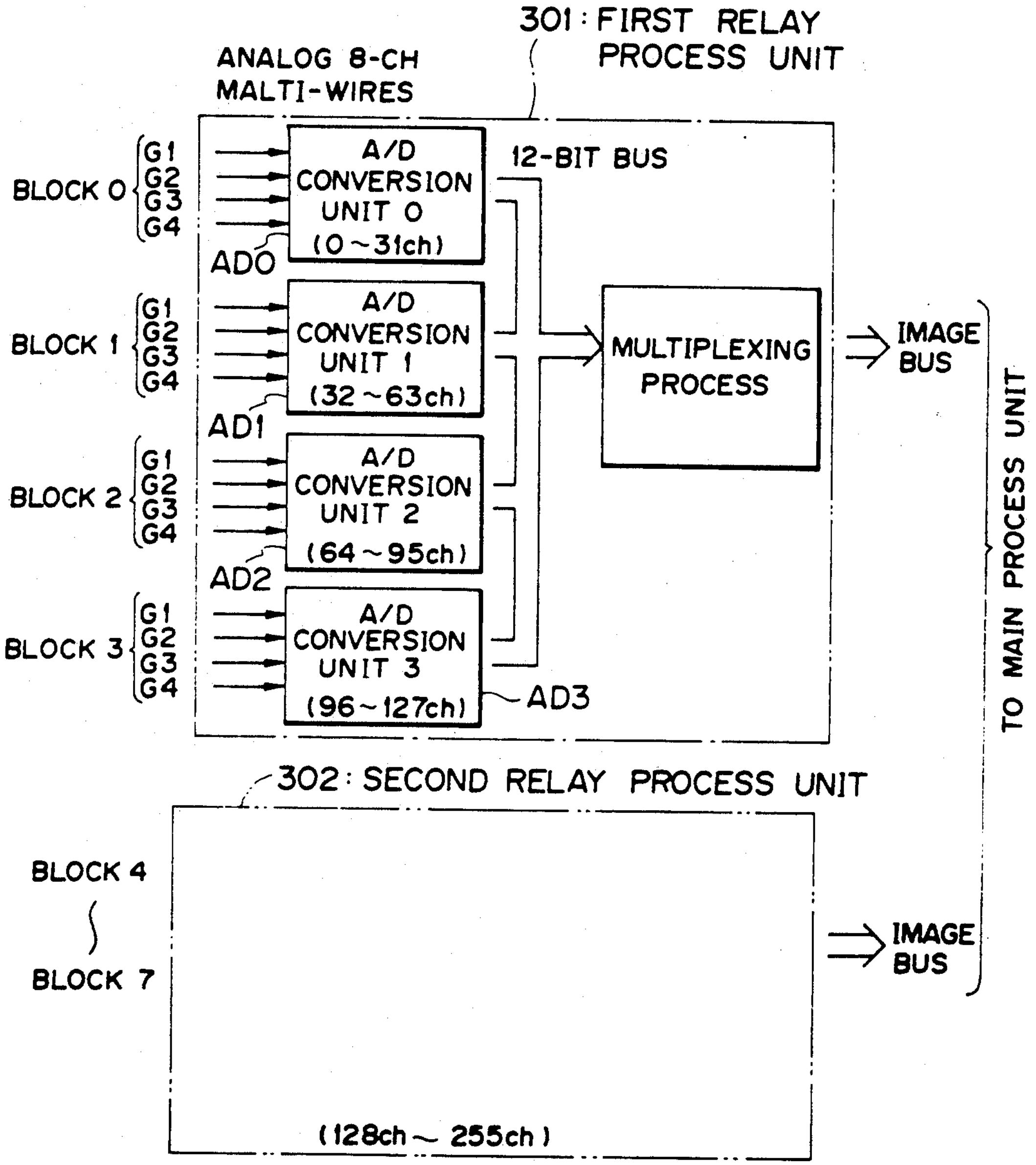
FIG. 16 is a block diagram of a relay process unit.

FIG. 13 through 15 show the signal process system of the above main sensor. The main sensors 7 and 8 perform exactly the same process for the obverse and reverse surfaces, so that an example of the signal process for the main sensor 7 for the obverse surface will be explained below.

As mentioned above, the main sensor 7 monitors the print surface 5 on which the examination domain is divided into the unit pixel domains 30. This examination domain lies in a direction perpendicular to the direction in which the web 1 moves. In this embodiment, as shown in FIG. 13, the examination domain is divided into 256 unit pixel domains. If this examination domain is divided into segments 0, 1, 2, 3, . . . 255 from one end thereof, then the unit pixel domains 30 are all optically connected through optical fibers 40 to all the light reception elements 20 in eight blocks B0, B1, B2 . . . B7.

Because the blocks B0, B1 . . . are all constructed in the same manner, the block B0 will be mainly explained hereinafter. Each light reception element 20 corresponds to each examination position. Therefore, if the light reception elements 20 are given numbers so as to correspond to the examination positions, the light reception elements, ranging from the zeroth light reception element to the thirty first light reception element, are arranged in block B0. One row of a printed board which is arranged in a direction perpendicular to the direction in which the web 1 flows is regarded as one unit printed board, then four rows of unit printed boards 51, 52, 53, 54 are integrally assembled. Eight light reception elements, the zeroth light reception element, the fourth light reception element, the eighth light reception element . . . the twenty fourth light reception dlement, and the twenty eighth light reception element, are arranged in the first unit printed board 51. Eight light reception elements, the first light reception element, the fifth light reception element, the ninth light reception element . . . the twenty fifth light reception element, and the twenty ninth light reception element, are arranged in the second unit printed board 52. Eight light reception elements, the second light reception element, the sixth light reception element, the tenth light reception element . . . the twenty sixth light reception element, and the thirtieth light reception element, are arranged in the third unit printed board 53. Eight light reception elements, the third light reception element, the seventh light reception element, the eleventh light reception element . . . the twenty seventh light reception element, and the thirty first light reception element, are arranged in the fourth unit printed board 54. When the amounts of the light reception elements mentioned above are generalized, the equation $0+4(n+8m)$ $(n=0\text{–}7, m=0)$ applies to the first unit printed board 51; the equation $1+4(n+8m)$ $(n=0\text{–}7, m=1)$ applies to the second unit printed board 52; the equation $2+4(n+8m)$ $(n=0\text{–}7, m=2)$ applies to the third unit printed board 53; and the equation $3+4(n+8m)$ $(n=0\text{–}7, m=3)$ applies to the forth unit printed board 54.

Pieces of analog information of eight channels (hereinafter referred to as ch) are respectively fed to the unit printed boards 51, 52 . . . through the eight light reception elements 20. These pieces of analog information are multiplexed by a sample-hold amplifier 200 and a multiplexer (MPX) into signals of one ch, and are taken out. The sample-hold amplifier 200 and the multiplexer (MPX) are an analog multiplexing means. The analog information, output through the light reception elements 20, is not a raw signal. The amount of analog information, which has been turned into a logarithm and luminous density by a log amplifier 201, is processed. The luminous density of a person varies logarithmically, so that it is possible to determine the information to a level close to an actual visual observation. This can be performed by turning the analog information into a logarithm. Furthermore, the analog information, which has been multiplexed by the above multiplexer (MPX), is output through a buffer amplifier 202. The log amplifier 201, the multiplexer (MPX) and the buffer amplifier 202 are integrally assembled in each of the unit printed boards 51-54.

The sample-hold amplifier 200 multiplexes a signal which has been sampled and taken out by a sample/hold signal SH into a time series-like signal. Eight-ch multi-wires G1, G2, G3, G4 for output extend from the unit printed boards 51, 52, 53, 54, respectively. The timing of a shift signal SH by this sample-hold amplifier 200 is in such a manner that the timing of the sample/hold signal is controlled so that an examination range having a length of 1 mm in the feed direction is always provided. This timing of the shift signal is based on a pulse signal which has been read by the abovementioned encoder 10, regardless of the transfer speed. The sample-hold amplifier 200 is so set that a time which is regarded as a unit is 100 s.

The 8-ch multi-wires G1, G2, G3, G4 which have been multiplexed, extend from each of the blocks B0, B1, B2, B3, and are connected, through a total of 32 multi-wires, to the first relay process unit 301 and the second relay process unit 302, both of which processes are in the next step. The information in the blocks B0 to B3 is sent to the first relay process unit 301, whereas the information in the blocks B4 to B7 is sent to the second relay process unit 302. A process for 16 signals is performed in both the first and second process units 301, 302. The same process is carried out in both the process units, and an example of the first relay process unit 301 will now be explained.

As shown in FIG. 15, in the relay process unit 301, the analog information which has been multiplexed by the above blocks B0, B1, B2 . . . is converted from analog to digital signals by A/D conversion units AD0, AD1, AD2, AD3 . . . . These A/D conversion units are each composed of an A/D converter to which an output buffer is attached. The digitized signals are multiprocessed by means of a key buffer 303, which is a digital multiplexing means. In this multiprocessing, signals G1, G2, G3, G4 sent from four blocks B0-B3 are multiplexed together. While the signals are being multiplexed, the information is rearranged in the order of the examination positions.

Figure 17:
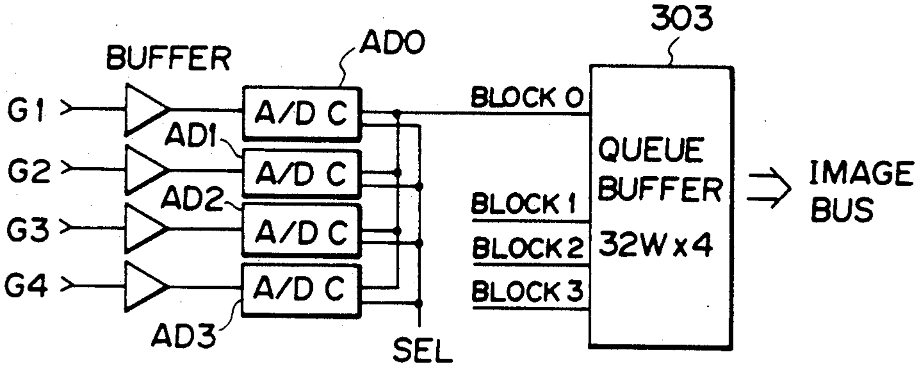
FIG. 17 is a block diagram of a multiprocessing circuit shown in FIG. 16.
Figure 18:
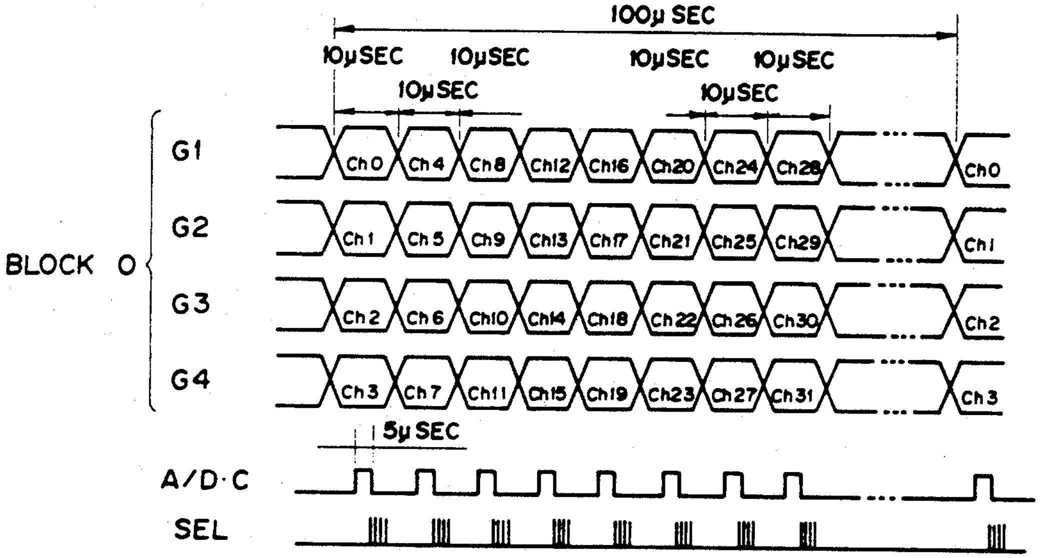
FIG. 18 is a time chart of an output signal from a queue buffer of a multiprocessing circuit shown in FIG. 17.
Figure 19:
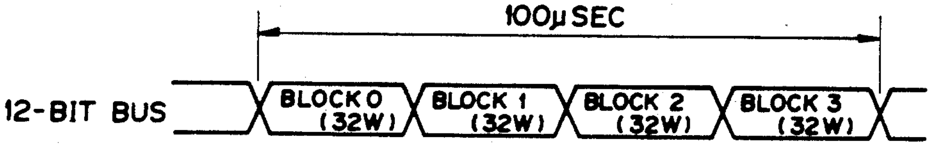
FIG. 19 is a time chart of an output signal from the queue buffer of FIG. 17 after a relay process has been completed.

An example of the multiprocessing for the block B0 will be explained. As illustrated in FIGS. 17 and 18, pieces of multiplexed information ch0, ch4, ch8 . . . , which were sent from the 8-ch multi-wires G1, G2, G3, G4, are read in the order of ch0, chl, ch2, ch3 . . . in the timing of a select signal, and are then stored in a queue buffer. This select signal selects the output buffer of the A/D converter. The above procedure will be carried out for all the rest of the blocks B1, B2 and B3. As shown in FIG. 19, 32 pieces of information for each block are output from the queue buffer 303 in the order of the blocks 0, 1, 2, and 3. These pieces of information are output in a time series-like manner within the unit time (100 s). That is, 128 pieces of examination information ch0, chl, ch2, ch3 . . . for four blocks are output in a time series-like manner in the order of examination position and are then sent to the defect process unit.

The information which has been processed and sent in a time series-like manner is processed in a parallel manner in the defect process unit. The monitoring of the obverse side of the print surface will now be explained. Multiplexed information, equal to the amount of 128 ch, for two groups of the blocks is transmitted through the relay process units 301, 02 from the main sensor 7. The multiplexed information is input via image buses and is processed in parallel. Digital information relayed from the one relay process unit 301 will now be explained. Pieces of the multiplexed information 0 ch-27 ch are buffered and processed sequentially in the comparison determination portions $C_0$, $C_1$ . . . . Pieces of the multiplexed information equal to the amount of 32 ch are buffered and processed at a time. At this phase, pieces of information equal to the amount of 32 ch out of pieces of information 128 ch-255 ch, which have been relayed from the other relay process unit 302, are also processed in a parallel manner at a time. Thus, information can be processed at high speeds in a parallel manner by arranging two systems of digital multiplexing lines.

In accordance with the above embodiment, a high-speed process can be carried out by multiplexing analog information and digital information as well. In addition, if attention is given to the signal lines, 256 pieces of information sent from the light reception elements can be transmitted over 32 lines because of analog multiplexing. Furthermore, because of digital multiplexing, the same pieces of information can be transferred over four lines, which is reduced from the 32 lines. Wiring can thus be simplified, whereby the cost can be reduced.

What is claimed is:

1. A printed material monitoring apparatus comprising:

sensor means for detecting light reflected from a number of unit pixel domains which are linearly arranged in a direction perpendicular to a direction in which a print surface of a printed material moves;

optical means for transmitting light reflected from the unit pixel domains to the sensor means; and a signal processing unit for processing signals transmitted from said sensor means, said sensor means comprising detection sensors each equipped with a plurality of light reception elements corresponding to one of said unit pixel domains respectively, said optical means including a plurality of optical fibers for transmitting light reflected from said unit pixel domains to said light reception elements respectively, and said light reception elements being arranged to form a plurality of rows of a fixed number of reception elements oriented in a direction in which the print surface of the printed material moves, said rows being arranged in a plurality of groups of a fixed number of rows of said light reception elements.

2. A monitoring apparatus according to claim 1, wherein said signal processing unit comprises along multiplexing means for multiplexing analog information detected by each of said light reception elements in said groups in which the rows of the light reception elements are arranged and digital multiplexing means for further digitizing and multiplexing the multiplexed analog information transmitted from each of said groups of the light reception elements.

3. A monitoring apparatus according to claim 2, wherein said analog multiplexing means includes a log amplifier and is used for multiplexing the analog information, transmitted from each of said light reception elements, which has been turned into a logarithm and luminous density by said log amplifier.

4. A monitoring apparatus according to claim 2, wherein the sensor means includes unit printed board means on which said light reception elements for a multiplexing process are grouped and said analog multiplexing means is arranged on said unit printed board means.

5. A monitoring apparatus according to claim 1, wherein said signal processing unit comprises analog multiplexing means for multiplexing analog information detected by each of said light reception elements in said groups in which the rows of the light reception elements are arranged and digital multiplexing means for further digitizing and multiplexing the multiplexed analog information transmitted from each of said groups of the light reception elements and wherein said monitoring apparatus further comprises a defect detecting and processing unit including comparison determination means in which a plurality of signal line systems, for multiplexing information by said digital multiplexing means, are arranged and in which multiplexed information from each of the signal line systems is processed and determined in a parallel manner.

6. A monitoring apparatus according to claim 1, wherein said sensor means comprises a mark sensor, first and second main sensors for obverse surface and reverse surface of a printed material and wherein the monitoring apparatus further comprises first and second relay process units respectively for converting and multiplexing analog informations from said first and second main sensors.

* * * * *